(12) United States Patent
Flask

(10) Patent No.: US 11,271,606 B2
(45) Date of Patent: *Mar. 8, 2022

(54) NETWORK TEST INSTRUMENT WITH CABLE CONNECTION AND SIGNATURE TESTING

(71) Applicant: VIAVI SOLUTIONS INC., San Jose, CA (US)

(72) Inventor: Robert Flask, New Palestine, IN (US)

(73) Assignee: VIAVI SOLUTIONS INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/834,998

(22) Filed: Mar. 30, 2020

(65) Prior Publication Data

US 2020/0228163 A1 Jul. 16, 2020

Related U.S. Application Data

(63) Continuation of application No. 14/836,770, filed on Aug. 26, 2015, now Pat. No. 10,644,748.

(51) Int. Cl.
*H04B 3/46* (2015.01)
*G01R 31/11* (2006.01)
*H04Q 5/00* (2006.01)

(52) U.S. Cl.
CPC .............. *H04B 3/46* (2013.01); *G01R 31/11* (2013.01); *H04Q 5/00* (2013.01); *H04Q 2213/1301* (2013.01); *H04Q 2213/13012* (2013.01); *H04Q 2213/1316* (2013.01)

(58) Field of Classification Search
None
See application file for complete search history.

(56) References Cited

U.S. PATENT DOCUMENTS

| | | |
|---|---|---|
| 5,805,585 A | 9/1998 | Javitt et al. |
| 6,820,225 B1 | 11/2004 | Johnson et al. |
| 6,856,138 B2 | 2/2005 | Bohley |
| 7,249,286 B1 | 7/2007 | Krishnan |
| 7,660,394 B1 | 2/2010 | Blank et al. |
| 8,416,699 B1* | 4/2013 | Lo .......................... H04L 43/50 370/242 |
| 2004/0102931 A1 | 5/2004 | Ellis et al. |
| 2004/0153264 A1 | 8/2004 | Teich |
| 2004/0251913 A1* | 12/2004 | Pham ..................... G01R 31/11 324/534 |
| 2005/0001631 A1 | 1/2005 | Cautereels et al. |
| 2006/0194547 A1 | 8/2006 | Davis |

(Continued)

OTHER PUBLICATIONS

Robert Flask, "Return Path Maintenance Plan", A Five Step Approach to Ensuring a Reliable Communications Path, ACTERNA, 2005, 17 pages.

*Primary Examiner* — Nasima Monsur
(74) *Attorney, Agent, or Firm* — Mannava & Kang, P.C.

(57) ABSTRACT

A test instrument can be coupled to a test point and measure signals in the network. The test instrument may determine whether the test instrument is connected to a cable of the network and provide notification if the test instrument is not connected to a cable. The test instrument may also detect when it is connected to a customer premises that has been previously been tested through reflected signal signatures.

20 Claims, 9 Drawing Sheets

(56) References Cited

U.S. PATENT DOCUMENTS

| | | |
|---|---|---|
| 2007/0121663 A1* | 5/2007 | Yousefi .................. H04L 12/12 |
| | | 370/446 |
| 2008/0109205 A1 | 5/2008 | Nasle |
| 2009/0282292 A1 | 11/2009 | Squire |
| 2009/0312881 A1 | 12/2009 | Venturini Cheim et al. |
| 2011/0078453 A1 | 3/2011 | Mueck et al. |
| 2012/0071197 A1 | 3/2012 | Hardacker |
| 2012/0213259 A1 | 8/2012 | Renken et al. |
| 2013/0060827 A1 | 3/2013 | Wegener |
| 2014/0064459 A1 | 3/2014 | Wahl et al. |
| 2014/0266238 A1 | 9/2014 | Furse et al. |
| 2014/0344874 A1 | 11/2014 | Olsen |
| 2015/0020129 A1* | 1/2015 | Chappell ............ H04N 7/17309 |
| | | 725/107 |
| 2015/0257118 A1 | 9/2015 | Siomina et al. |
| 2017/0005723 A1 | 1/2017 | Prause |
| 2017/0034507 A1 | 2/2017 | Harris et al. |

\* cited by examiner

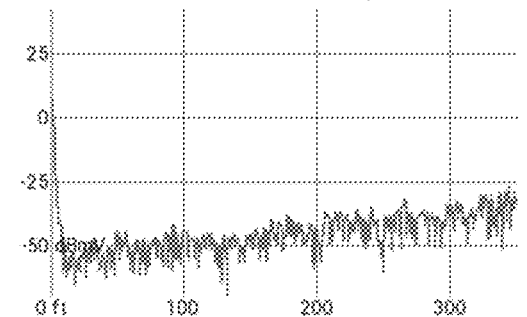
PosiScan Signature – No Cable Connected – No Reflection showing
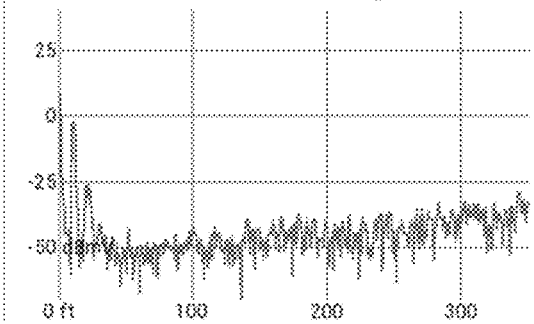
Posi Scan Signature – Short Cable Connected – Single primary connection showing
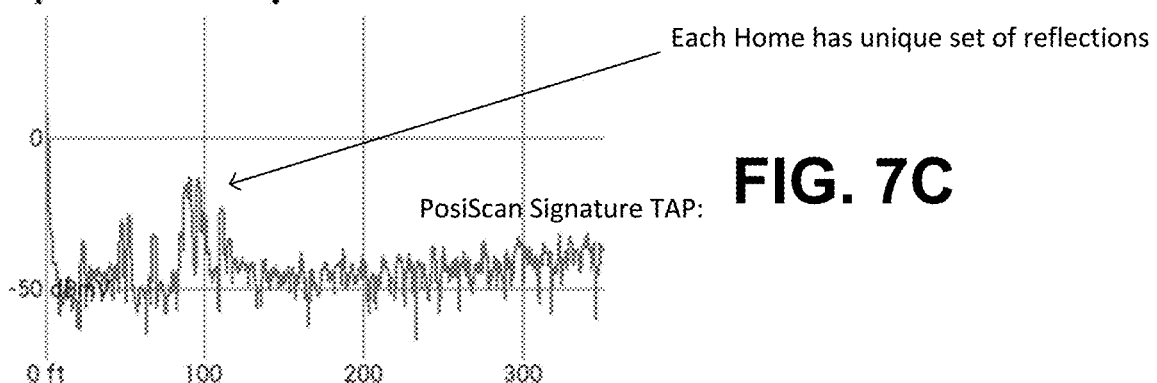

Port 2 Connection Error
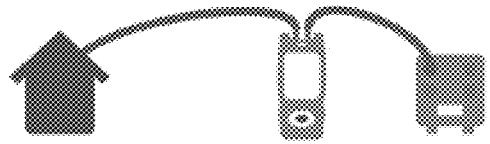
PosiScan detected a cable length less than 5 feet. This indicates a problem with the connection on port 2. Check the tightness of the cable attached to port 2 and press retry to check the connection again.
FIG. 8A
Non-Unique Home Detected
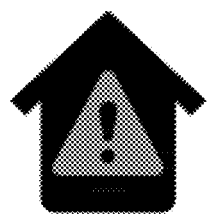
A non-unique home has been detected.
FIG. 8B

NETWORK TEST INSTRUMENT WITH CABLE CONNECTION AND SIGNATURE TESTING

PRIORITY

This application is a Continuation of commonly assigned and co-pending U.S. application Ser. No. 14/836,770 filed Aug. 26, 2015, the disclosure of which are hereby incorporated by reference in their entireties.

BACKGROUND

Service provider networks typically delivers services, such as digital television, high-speed Internet, Voice-over-IP (VoIP), etc., to customer premises. Also, the networks typically carry bi-directional traffic. For example, a typical cable network is a two-way hybrid fiber-coaxial (HFC) network that supports point-to-multipoint transmission in the downstream direction using digital signals or a mix of analog and digital signals, and multipoint-to-point transmission in the upstream direction. Downstream signals, which carry broadcast digital TV signals, Internet traffic, etc., are distributed via a fiber optic connection from a head-end to a node that converts the optical signals to electrical signals and then distributes the signals to customer premises via a tree and branch coaxial cable distribution network termed 'cable plant'. Recently, service providers are running fiber to the customer premises to improve bandwidth. At the customer premises, terminal equipment supports the delivery of services, which may include video, data and voice services, to customers for example via cable modems. Upstream signals from the customer premises may carry phone and Internet traffic. The upstream signals propagate from the branches of the cable plant towards the headend of the network.

The upstream and downstream signals are prone to impairments originating at various locations in the network. There may be numerous devices, cable segments and connectors located between the fiber optic node and the customer premises equipment where defects can occur, and defects and impairments can occur at different customer premises that can impact the signal quality of other customer premises. Tracing a source of an impairment typically requires that a technician travels to different network locations and takes measurements to locate the sources of the impairments, and generally, throughout the day, technicians may travel to multiple locations to measure, diagnose and correct impairments. Portable network testing devices currently used in the industry may help to identify certain types of defects by performing various measurements, such as spectral and noise measurements.

BRIEF DESCRIPTION OF DRAWINGS

Features of the present disclosure are illustrated by way of examples shown in the following figures. In the following figures, like numerals indicate like elements, in which:

FIGS. 7A-D show signatures, according to examples of the present disclosure; and FIGS. 8A-B show information that may be displayed on a test instrument, according to examples of the present disclosure.

DETAILED DESCRIPTION

Figure 1:
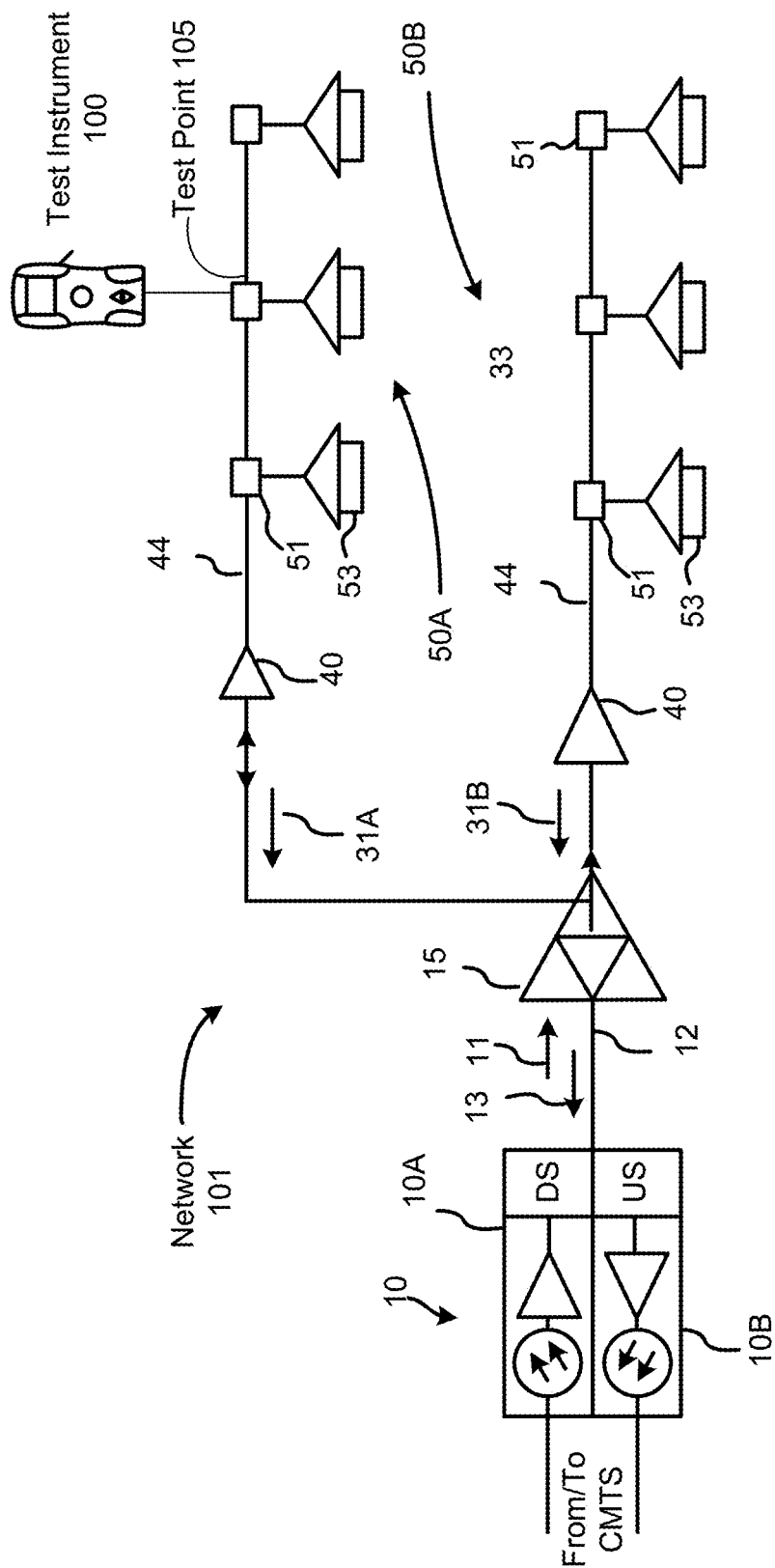
FIG. 1 illustrates a network with a test instrument connected at a test point, according to an example of the present disclosure.

For simplicity and illustrative purposes, the present disclosure is described by referring mainly to examples thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. Throughout the present disclosure, the terms "a" and "an" are intended to denote at least one of a particular element. As used herein, the term "includes" means includes but not limited to, the term "including" means including but not limited to. The term "based on" means based at least in part on.

A test instrument for networks may be connected to a network to measure parameters or characteristics of signals transmitted in the network. A test instrument for example is an apparatus that can connect to a cable, for example via a port, and can determine information about signals transmitted on the cable. The cable may be connected to or be part of a system, e.g., a network, and the test instrument can determine information about signals transmitted in the network via the cable. The test instrument may be a handheld portable device or a larger device. The test instrument may include a single port or multiple ports to connect to a single cable of the network or to multiple cables of the network simultaneously to take measurements.

Some examples of signal measurements performed by the test instrument may include spectral and noise measurements. The test instrument may use Frequency-Domain Reflectometry (FDR) and/or Time-Domain Reflectometry (TDR) to measure reflections, i.e., reflected signals. Reflectometry pulses (e.g., TDR or FDR pulses) may be generated and output via a port of the test instrument, and characteristics of the reflected signals, such as amplitude and reflection time, i.e., the time it takes for the pulse to return to the port, are measured to determine signal signatures, detect locations of impairments, etc. Signal levels are measured and displayed for example to verify proper levels arriving at the test point. Frequency response is measured for example to verify proper losses and to uncover any roll-off or sharp changes in response.

According to examples of the present disclosure, the test instrument may determine whether its port is connected to a cable of a predetermined minimum length prior to taking signal measurements. For example, using a measurement technique such as FDR or TDR, the test instrument determines whether it is connected to an external wire, and may display a notification that it is improperly connected to wiring if the test instrument determines that it is not connected to a minimum length cable. Cable connection testing may be used to verify a cable is properly connected before testing. The test instrument may determine TDR and/or FDR signatures comprised of measured characteristics of reflected signals. A unique signature may be determined for each test location, such as a signature for each customer premises. The measured characteristics may include amplitude (e.g., signal level in decibels), reflection time, peak detection at identified times, etc. From the signatures, the test instrument can determine whether it is connected to different customer premises than previously connected and to compare the signature to stored signatures to determine whether the test instrument is connected at a desired location. Notifications may be displayed regarding the signature determinations. Notifications may also be displayed identifying and notifying if there are unexpected reflections on a section of wiring.

The cable connection testing may be used to insure that measurements are being taken from a properly connected cable. Also, the signature testing may be used to determine whether measurements are being taken at desired locations that have predetermined signatures. For example, technicians may be required to take many measurements per day and this testing ensures that the technicians are actually taking the measurements rather than faking measurements. For example, if a measurement is taken when the test instrument is not connected to a cable, the measurements may indicate a flat signal that can be construed as a proper signal, or a technician may mock-up a piece of cable with an impedance connected on one end, such as a splitter, and connect the other end to the test instrument to fake measurements at different locations. The cable connection testing ensures a cable of proper length is connected to the test instrument for taking signal measurements, and the signature comparison can determine that the test instrument is not connected to the same cable for every measurement and can also be used to determine that the measurements are being taken at desired locations.

The test instrument may include a processor, display, and data storage to store and display measurements and notifications, and to store signatures and other information. The test instrument may include a network interface, such as WiFi, Bluetooth, Ethernet, cellular, etc., to connect the test instrument to other devices via a network, and to transmit the stored data to other devices or computers. In one example, the test instrument is a portable, hand-held device that may connect to the cloud or any remote computer via the network interface. In other examples, the test instrument may be part of a larger system. The test instrument may be used to measure signals in any suitable type network, include cable television networks, optical networks, in-home wiring, etc.

FIG. 1 illustrates a test instrument 100 connected to a network 101 according to an example of the present disclosure. In this example, the network 101 is a cable TV network but the test instrument 100 may be used in other types of networks. Network 101 shown in FIG. 1 may be a local portion of a hybrid fiber coaxial (HFC) network that delivers Cable Television (CATV) signals, including digital TV signals and data and control signals, to end users at customer premises 53.

A fiber-optic node 10 of the cable network 101 for example includes a downstream (DS) optoelectronic converter 10A that converts downstream (DS) optical signals generated by a remote Cable Modem Termination System (CMTS) (not shown) into downstream electrical RF signals 11, and an upstream (US) electro-optic converter 10B that converts upstream (US) electrical RF signals 13 into US optical signals for upstream transmission to the remote CMTS. The fiber-optic node 10 is coupled via a coaxial cable 12 to a bidirectional amplifier 15, which amplifies the downstream RF signals 11 for distribution to first and second groups of customer premises 53A and 50B. The downstream RF signals 11 generated by the downstream optoelectronic converter 10A of the fiber node 10 are distributed to a plurality of end-of-the-line subscribers, or end users for example via one or more trunk coaxial cables 44 and subscriber taps 51. At the customer premises 53, the DS signals are demodulated using cable modems (not shown). One or more two-way trunk RF amplifiers 40 may further be provided in each trunk cable 44 to suitably amplify the upstream and downstream CATV signals on their way to and from the customer premises 53. The first and second groups of customer premises 50A and 50B may send upstream signals 31A and 31B, respectively, which may be combined by the bidirectional amplifier 110 into the upstream RF signal 13 propagating towards the fiber node 106 for delivering to the remote CMTS at the headend (not shown). The cable network 101 may serve a large number of customer premises, which may be connected by taps 51 to a plurality of different cable trunks 44 at a plurality of different locations. The trunk cables 44 may be buried in the ground or they may be elevated above the ground on utility poles, or a combination of both. In other examples, fiber cables may be run to the home and the test instrument 100 may connect to the fiber cables.

The test instrument 100 may be connected to the cable network 101 at a desired test point to test signals (upstream and/or downstream) passing through the test point. The test instrument 100 is shown as connected at test point 105. The test instrument 100 may be connected at any location where connections are available to connect to the network 101. For example, the test instrument 100 is connected to the network 101 via a test access point (tap) to measure signals flowing through the tap. The tap for example is a 3 port hardware device and one port is monitor port connectable to the test instrument 100 to measure signals in the network passing through the tap. The tap may provide more than test point access. For example, the tap may be a hardware device that 'taps" off the line and feeds one or more customer premises and is where the test instrument 100 can be connected.

The test instrument 100 may include one or more ports to connect to the test point 105. In an example, the port(s) include coaxial RF cable connectors. It will be appreciated that test instrument 100 may also have other non-cable ports, for example to connect to a computer or to an external display, such as but not exclusively one or more USB ports and the like.

The test instrument 100 is inserted by coupling a port of the test instrument 100 to a cable in the network 101. In this manner, signals in the network are received at the test instrument 100. The test instrument 100 for example may include a dual port test instrument. For example, one port may be connected downstream such as toward a customer premises, and one port may be connected upstream towards a network node. Signals (e.g., upstream or downstream) in the network may flow through the test instrument 100 and may be measured. In another example, the test instrument 100 may be a single port device. For example, the test instrument 100 is connected to the network via a test access point (tap) to measure signals flowing through the tap at the test point 105. The tap for example is a 3 port hardware device and one port is monitor port connectable to the test instrument 100 to measure signals in the network passing through the tap. A dual port test instrument may also be connected to a tap.

Figure 2A:
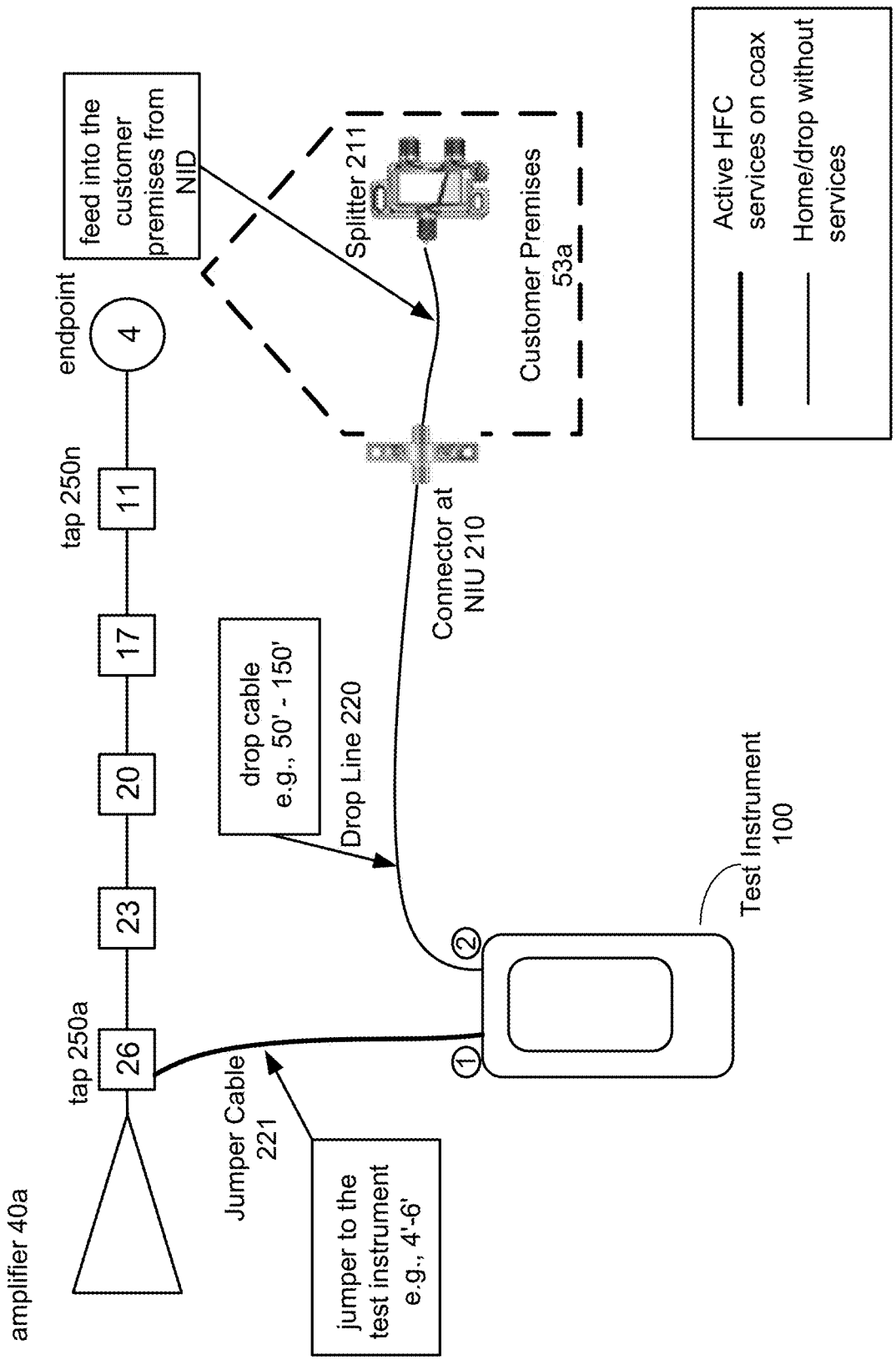
FIGS. 2A-B illustrates multiple test points, according to examples of the present disclosure.
Figure 2B:
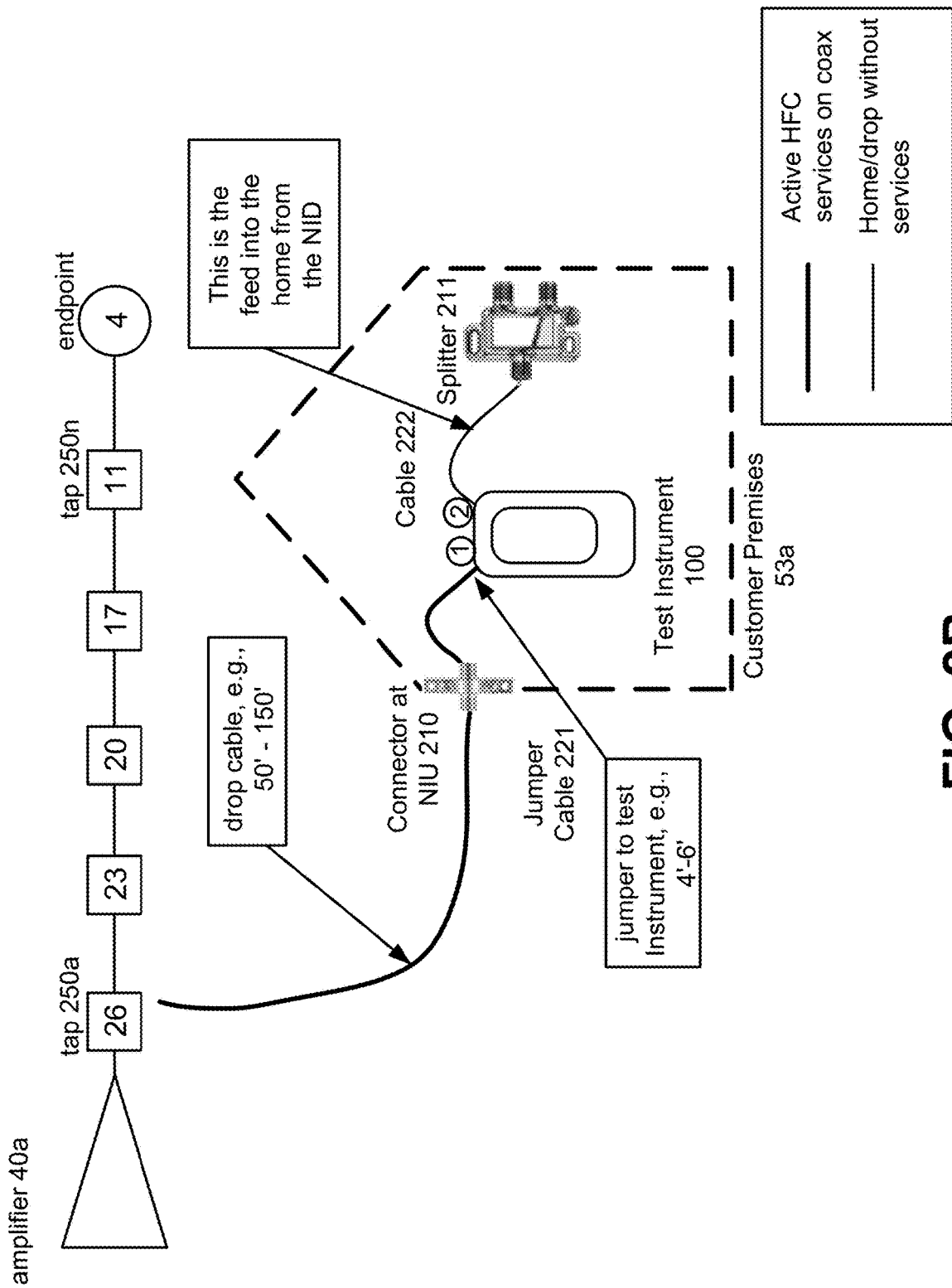

FIGS. 2A-B show examples of connecting the test instrument 100 at different segments of the network 101. FIG. 2A shows the test instrument 100 connected to a tap 250a in a portion of the network 101 between amplifier 40a and customer premises 53a. There may be multiple taps 250a-n and the values (e.g., 26, 23, 20 . . . ) shown for the taps 250a-n are examples of tap values, e.g., attenuation measured at the tap, in decibels. The downstream signal is significantly attenuated by the time it reaches the endpoint, which may be a customer premises. A customer premises may also be connected via a drop line 220, also referred to as a trunk line, at each tap. The test instrument 100 in this example is dual port device with ports 1 and 2. Port 1 is connected via a jumper cable 221, e.g., 4-6 feet coaxial cable, to the tap 250a. Port 2 is connected to network interface unit (NIU) 210 of customer premises 53a. The NIU 210, also referred to as a network interface device, typically is attached to the outside of the customer premises and is where the drop line connects to the in-home or in-customer-premises wiring. The NIU 210 is typically connected to a ground block. The splitter 211 may be in the customer premises 53a and is an impedance that reflects a reflectometry pulse output from the test instrument 100 as is further described below.

Connecting the test instrument 100 as shown in FIG. 2A can be used to test wiring and signals at the tap 250a, which may be at a node or telephone pole. For example, a reflectometry pulse is output at port 2 from the test instrument 100 to determine whether there is any impairments, such as broken cable, in the drop line 220. Prior to taking measurements to detect the impairments, the test instrument 100 determines whether port 2 is connected to a cable of a predetermined minimum length and also determines if the signature of a reflected signal received at port 2 is different than a previous signature and/or specific to the location of the test point for example to help ensure that port 2 is properly connected to the drop line 220 for the desired customer premises. Test instrument 100 may be a single port device. For example, the single port may be connected to the drop line 220 to measure signals on the drop line 220.

FIG. 2B also shows the test instrument 100 connected at a different test point, such as between the NIU 210 and the splitter 211. From this test point, the test instrument 100 may take measurements to identify impairments at the customer premises 53a. Similarly to FIG. 2A, prior to taking measurements to detect the impairments, the test instrument 100 determines whether port 2 is connected to a cable of a predetermined minimum length, such as the cable 222 connected to splitter 211 and may also determine if the signature of a reflected signal received at port 2 is different than a previous signature and/or specific to the current location or customer premises.

Figure 3A:
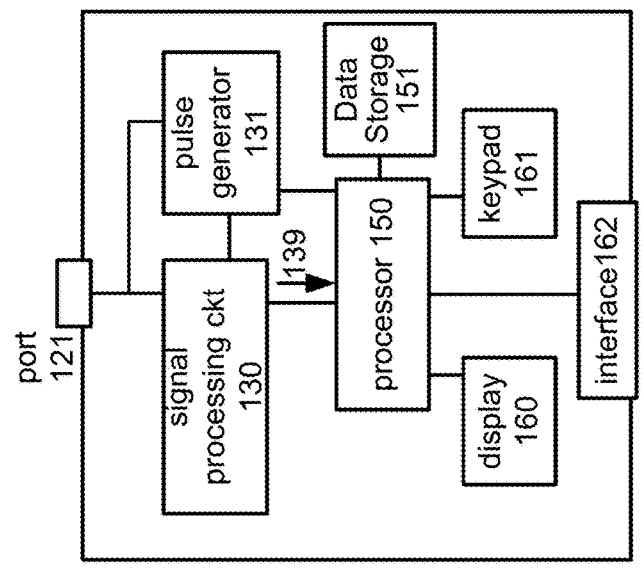
FIGS. 3A-B illustrate a single port and a dual port test instrument, according to examples of the present disclosure.
Figure 3B:
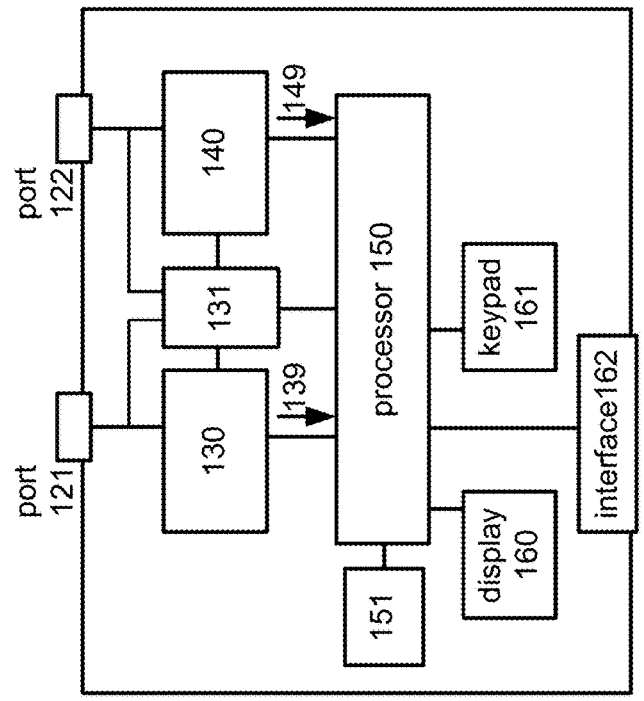

FIGS. 3A-B show examples of components of the test instrument 100, according to an example. FIG. 3A shows an example of the test instrument 100 as a single port device with only port 121 to connect to network 101 to measure signals in the network 101, and FIG. 3B shows an example of the test instrument 100 as a dual port device with ports 121 and 122 to connect to the network 101 to measure signals. As shown in FIG. 3A, a signal processing circuit 130, which may be connected to the port 121, is configured for processing signals from the network 101 that are received via the port 121 to obtain measurement data 139. A pulse generator 131 (e.g., TDR or FDR) generates reflectometry pulses which are output via port 121 and are reflected back to the port 121 from impedances in the network 101. The reflected pulses, also referred to as reflected signals, are measured by the signal processing circuit 130 to generate the measurement data 139 and determine a signature from the measurement data. A control processor 150 may be communicatively coupled to the signal processing circuit 130 and is configured to process the measurement data 139 and make the determinations described herein, such as whether the port 121 is connected to a minimum length cable, determine a signature of the signal, determine whether the signature is unique to the test point or whether the signature is the same as a previous signature, testing wire integrity, etc. The processor 150 may display measurements and notifications on display 160. A keypad 161, touch screen or another I/O device may be provided to receive user input. Interface 162 may include one or more interfaces, such as USB, Bluetooth, WiFi, etc. The signal processing circuit 130 and processor 150 may be embodied using a single dedicated or shared hardware processor or using multiple hardware processors, and/or a combination of software and hardware. Examples of hardware processors that may be used to implement the components including a digital signal processor (DSP), application specific integrated circuit (ASIC), field programmable gate array (FPGA), network processor, system on a chip, microprocessor, Complex Programmable Logic Device (CPLD), erasable programmable logic device (EPLD), simple programmable logic device (SPLD), or macrocell array. Data storage 151 may store measurement data, signatures or any information used by the test instrument 100. In an example, one or more of the functions and steps of the methods may be performed by the processor 150 or other hardware executing machine readable instructions stored in a non-transitory computer readable medium, such as the data storage 151. The data storage may comprise RAM (random access memory), ROM (read only memory), EPROM (erasable, programmable ROM), EEPROM (electrically erasable, programmable ROM), hard drives, flash memory, or other types of storage devices, which may be volatile and/or nonvolatile.

FIG. 3B is similar to FIG. 3A but includes additional port 122 connectable to the network 101 and signal processing circuit 140 for processing signals from the network 101 that are received via the port 122 to obtain measurement data 149. Processor 150 process the measurement data 149 to make determinations described herein. The ports 121 and 122 allow the test instrument 100 to connect simultaneously to an upstream portion of the network 101 and to a downstream portion of the network 101. In an example, the port 121 receives downstream signals and the port 122 receives upstream signals, and measurement data 139 is downstream measurement data and measurement data 149 is upstream measurement data.

Figure 4:
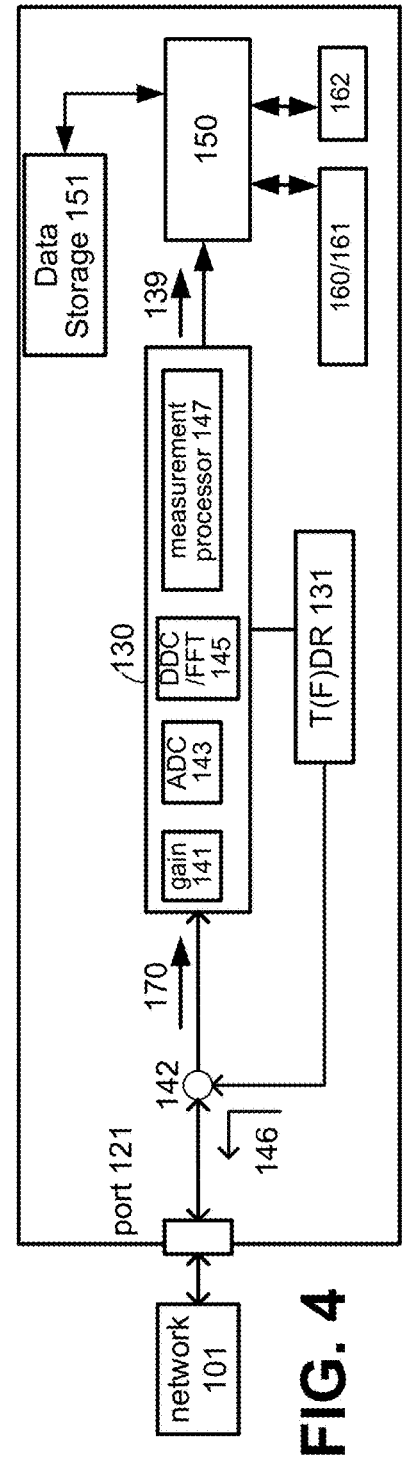
FIG. 4 illustrates circuit components of a test instrument, according to an example of the present disclosure.

FIG. 4 shows additional details of the components of the test instrument 100 shown in FIG. 3A for the single port example. Although not shown, similar components may be provided for the dual port example shown in FIG. 3B. FIG. 4 shows pulse generator 131, which may be a TDR or FDR reflectometer. The pulse generator 131 may be coupled to the signal processing circuit 130 and the port 121. The pulse generator 131 injects a probe signal (e.g., reflectometry pulse 146) into the network 101 through a coupler or switch 142 and port 121. The measurement processor 147 may include reflectometer control logic for controlling the operation of pulse generator 131 and processing measurement results.

The signal processing circuit 130 may include an optional gain control unit 141 that is operationally followed by an Analog to Digital Converter (ADC) 143, a Digital Downconverter/Fast Fourier Transform (DDC/FFT) unit 145, and measurement processor 147. The DDC/FFT logic 145 may be configured to obtain a frequency spectrum of signal 170 (e.g., reflected signal) within the frequency band of transmission, for example by performing the FFT of 170, and/or to tune to an active channel using digital down-conversion.

The active channel to tune to may be selected, for example, by a user command or automatically by internal tester programming, and communicated to the DDC/FFT logic 145 by the control processor 150 and/or the measurement processor 147.

The measurement processor 147 may be configured to obtain measurement data 139 related to signal 170, including diagnostic information, from the output of the DDC/FFT unit 145 and optionally by querying the ADC 143 and/or the gain control unit 141. The measurement data 139 may include frequency of each channel detected in the signal 170, and may also include channel diagnostic information for one or more of the detected or active channels. The channel diagnostic information may include at least one of the following channel parameters or characteristic: signal level of the detected downstream channel, a modulation type of the detected downstream channel, signal-to-noise (SNR) for the channel, bit error ratio (BER) for the detected channel, modulation error ratio (MER) for the detected channel, ingress under the carrier, in Channel Frequency Response (ICFR), adaptive equalization coefficients, Digital Quality Index (DQI), etc. To this end, the measurement processor 147 may include (not shown) a frequency scan logic for controlling the DDC/FFT unit 145 and obtaining active channel data therefrom, and a QAM demodulator for demodulating the selected channel; the QAM demodulator may include an adaptive equalizer, and measurement control logic (MCL) to determine various performance-related data and perform a variety of service level tests and to obtain the channel diagnostic information.

Figure 5:
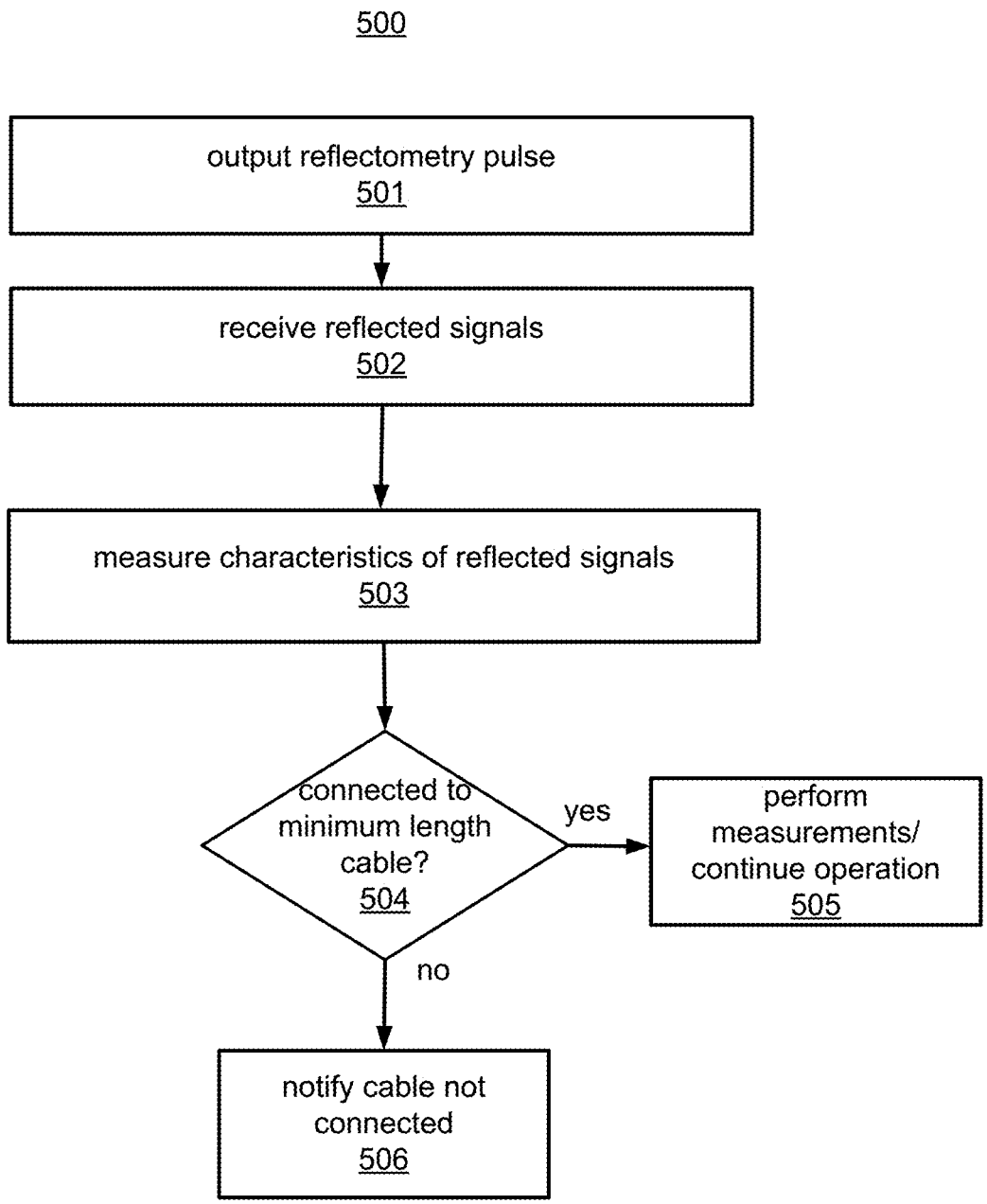
FIGS. 5-6 illustrate methods, according to examples of the present disclosure.

FIG. 5 illustrates a method 500 for determining whether a test instrument is connected to a minimum length cable. The method 500 and other methods described herein are described by way of example as being performed by the test instrument 100 shown in FIGS. 1-4, but the methods may be performed by other test instruments. Also, one or more steps may be performed in different orders or substantially simultaneously. At 501, a reflectometry pulse, such as a TDR or FDR pulse, is output from the test instrument onto a cable connected to or in the network 101. For example, the pulse generator 131 generates the pulse and it is output via one or more ports (e.g., 121 and/or 122) of the test instrument 100. The amplitude and frequency of the pulse may be adjusted or selected as needed. Short pulses may be used to test short cables and longer pulses with higher signal strength may be used to test longer cables. The pulse generator 131 may output multiple reflectometry pulses.

At 502, a reflected signal or signals are received (e.g., signal 170) for example via port 121. For example, the reflectometry pulse travels down the cable in the network 101 and pulse is reflected by an impedance, such as splitter 211 shown in FIGS. 2A-B, and the reflected signals travel back towards the port 121 and are received at the port 121.

At 503, characteristics of the reflected signals are measured. For example, reflection time is measured, which is the length of time it takes to receive the reflected signal from the output of the reflectometry pulse. For example, measurement processor 147 invokes the pulse generator 131 to send the reflectometry pulse and starts keeping track of the time or notifies the processor 150 that the pulse is sent and the processor 150 keeps track of the time. The measurement processor 147 determines when the reflected signal corresponding to the reflectometry pulse is received and the processor 150 is notified of the receipt of the reflected signal. The time of receipt is determined, and the length of time between the sending of the reflectometry pulse and the receiving of the corresponding reflection signal is the reflection time. Other characteristics of the reflected signal may also be measured, including signal strength, as discussed above.

At 504, the processor 150 determines whether the test instrument is connected to a minimum length cable based on at least one of the measured characteristics of the reflected signal. The minimum length cable for example is a cable of predetermined length. For example, a minimum length may be 6 inches or one foot or any length, such as any length that is indicative measurements are being taken from signals received via a connected cable rather than from no connected cable. In an example, measured reflection time is used to determine length of a connected cable. For example, cable speed is determined and may be a preset value stored in the data storage 151. From the cable speed and reflection time, distance is determined. The distance is assumed to be the cable length of a connected cable. If the determined cable length is greater than or equal to the length of the minimum length cable, then the processor 150 determines that the test instrument 100 is connected to a cable of at least the minimum length. Then, at 505, other measurements and operations are performed and a notification may be displayed that the cable is connected. If the determined cable length is less than the length of the minimum length cable, then the processor 150 determines that the test instrument 100 is not connected to a cable of at least the minimum length. At 506, the processor 150 may generate a notification that a cable is not connected and may not allow measurements or further processing until the cable is connected. FIG. 8A shows an example of information that may be displayed on the display 160 to indicate that a cable is not connected. The user may choose to ignore the notification or configure or retry after connecting again. Notifications may also be in the form of messages transmitted from interface 162 to other computers or devices. In addition to reflection time, other measured signal characteristics may be considered, such as amplitude (signal strength).

Figure 6:
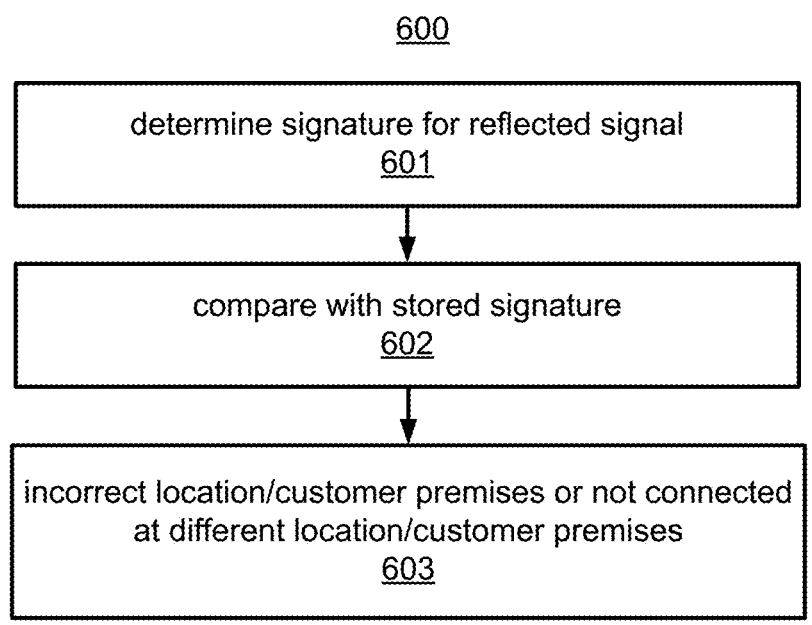
Figure 7D:
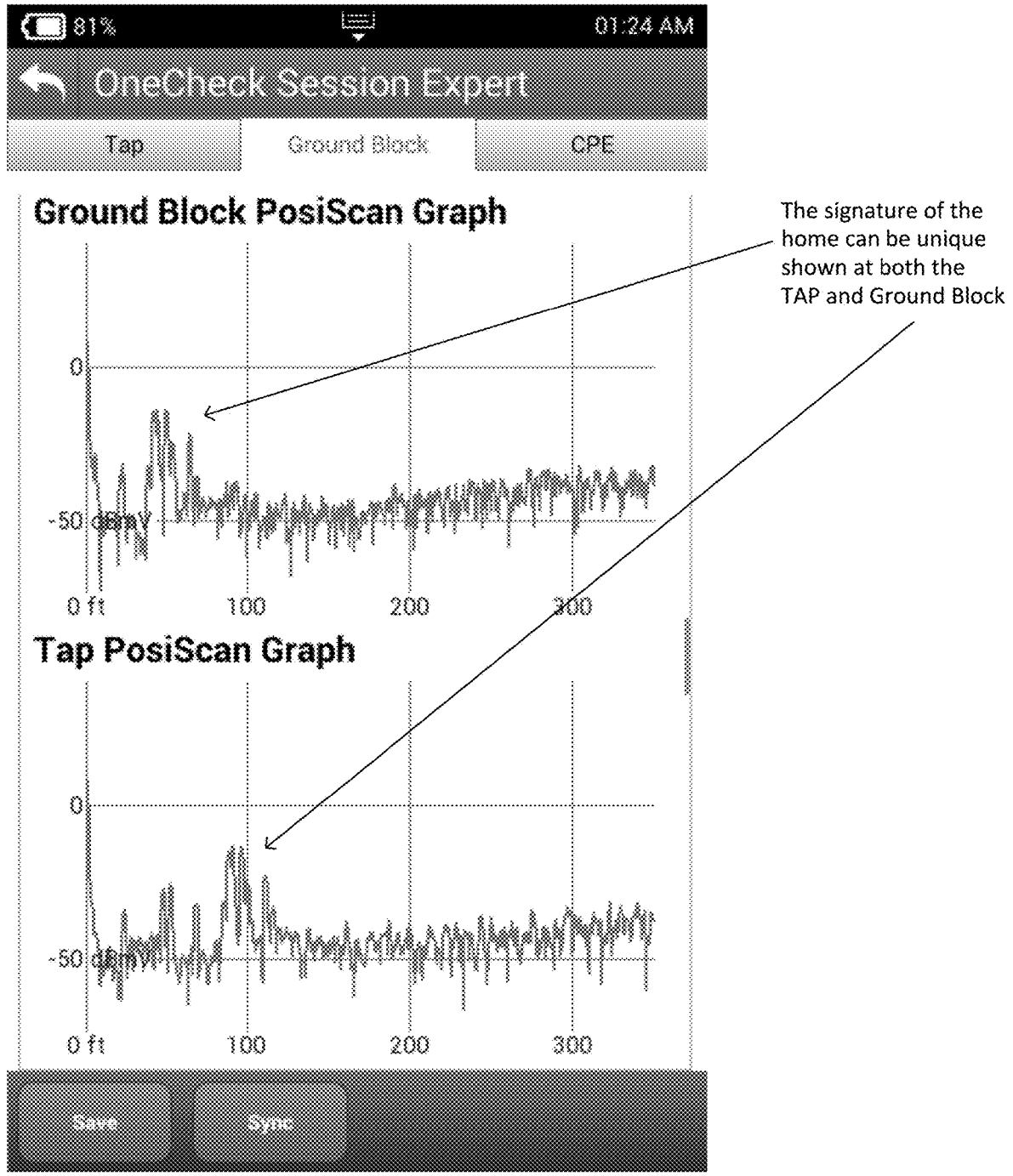

FIG. 6 illustrates a method 600 for comparing signatures of reflected signal, which may be performed to determine whether the test instrument 100 is capturing signals at a location or customer premises that is different from a previous one, and to determine whether the test instrument 100 is connected at a desired location. At 601 a signature is determined for a reflected signal. For example, after step 505 of the method 500, the signature is determined of the reflected signal. The signature may include amplitude (e.g., signal level in decibels), reflection time, peak detection at identified times, and/or other measured characteristics. Signatures may be determined by the measurement processor 147 and/or processor 150 and examples of signatures are shown in FIGS. 7C-D.

At 602, the processor 150 compares the signature determined at 601 with a stored signature. For example, signatures are stored in the data storage 151 for different test points. The stored signatures may be associated with different test points, customer premises and geographic locations. The stored signatures may be signatures previously captured by the test instrument 100 at other test points. Also, signatures may be loaded into the test instrument 100 for example via interface 162.

At 603, the processor 150 determines whether the test instrument 100 is connected at an incorrect location or customer premises or is not connected to a different location or customer premises from which it was previously connected based on the comparison at 602. For example, a signature is determined for a customer premises. The signature is stored in the data storage 151. A signature is subsequently determined when the test instrument 100 is supposed to be connected at another location to measure signals for a second customer premises. The processor 150 compares the signatures. If the signatures are the same, the processor 150 determines that the test instrument 100 has not connected at the second location. For example, either the test instrument 100 is still connected at the first location or the technician may have mocked up a piece of cable with an impedance connected on one end to fake measurements at different locations. A notification may be displayed that indicates a non-unique home or signature is detected. FIG. 8B shows an example of information that may be displayed on the display 160 to indicate that the test instrument is detecting a non-unique signature. The user may choose to ignore the notification or configure or retry after connecting again.

In another example, the test instrument 100 stores signatures for multiple different customer premises. The processor 150 may determine whether the measured signature matches a stored signature to determine whether the test instrument 100 is currently connected at the desired location.

FIGS. 7A-D show examples of signatures. These figures show the reflected signals for example measured at the ground block, such as shown in FIG. 2B, and at the tap, such as shown in FIG. 2A. The graphs may be displayed on the test instrument display 160. FIG. 7A shows the signature of reflected signals when no cable is connected. FIG. 7B shows a signature when the test instrument 100 is connected at the ground block, such as shown in FIG. 2B, and FIG. 7C shows a signature when the test instrument 100 is connected at the tap, such as shown in FIG. 2A. Each home or customer premises may have a unique set of reflections such as indicated in FIG. 7C that represent its signature. FIG. 7D shows that the same signature of the home may be recognized from different test points (e.g., ground block and tap) connected to the home. Also, from the display shown in FIG. 7D, the signatures may be saved to the data storage 151 and synchronized with remote storage, such as on the cloud.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims and their equivalents in which all terms are meant in their broadest reasonable sense unless otherwise indicated.

What is claimed is:

1. A test instrument comprising:
   an input to receive a reflected pulse, wherein the reflected pulse is a pulse generated by a pulse generator that is reflected and received via at least one port of the test instrument;
   a measurement circuit to measure characteristics of the reflected pulse received via at least one port, wherein the measured characteristics comprises at least one of amplitude, reflection time, or peak detection of the reflected pulse;
   a data storage storing a signature of the reflected pulse for a predetermined test location, wherein the signature is a unique signature associated with the predetermined test location; and
   a processing circuit to:
      determine whether the at least one port is connected to a minimum length cable based on the measured characteristics of the reflected pulse, and
      use a signature comparison technique to determine whether a signature determined from the measured characteristics of the reflected pulse matches the stored signature to determine whether the test instrument is connected at the predetermined test location, wherein a match between the signature determined from the measured characteristics and the stored signature that is unique to the predetermined location indicates that the test instrument is connected at the predetermined test location associated with the stored signature.

2. The test instrument of claim 1, wherein, in response to determining the at least one port is not connected to a minimum length cable, the processing circuit performing at least one of providing notification that the test instrument is not connected to a minimum length cable and preventing measurements of the signals received via the at least one port.

3. The test instrument of claim 1, wherein to determine whether the at least one port of the test instrument is connected to a minimum length cable, the processing circuit is to determine a reflection time of the pulse, and determine whether a minimum length cable is connected to the at least one port based on the reflection time.

4. The test instrument of claim 3, wherein the processing circuit determines whether a minimum length cable is connected to the at least one port based on the reflection time and a signal transmission velocity of the minimum length cable.

5. The test instrument of claim 1, wherein the pulse comprises a time domain reflectometry pulse or a frequency domain reflectometry pulse.

6. The test instrument of claim 1, wherein the measured characteristics comprises reflection time and amplitude of the reflected pulse.

7. The test instrument of claim 1, wherein the reflected pulse comprises the pulse reflected from an impedance back towards the at least one port.

8. The test instrument of claim 1, wherein the signature is based on amplitude and time of at least one peak in the reflected pulse.

9. A non-transitory computer-readable storage medium having an executable stored thereon, which when executed instructs a processor to perform a method as follows:
   receive a reflected pulse, wherein the reflected pulse is a pulse generated by a pulse generator that is reflected and received by a port the test instrument;
   measure characteristics of the reflected pulse received via the port, wherein the measured characteristics comprises at least one of amplitude, reflection time, or peak detection of the reflected pulse, and wherein the reflected pulse is the pulse reflected from an impedance in a system;
   store a signature of a reflected pulse for a predetermined test location, wherein the signature is a unique signature associated with the predetermined test location;
   determine, by a processing circuit, whether the port is connected to a minimum length cable based on the measured characteristics of the reflected pulse; and
   use a signature comparison technique to determine whether a signature determined from the measured characteristics of the reflected pulse matches the stored signature to determine whether the test instrument is connected at the predetermined test location, wherein a match between the signature determined from the measured characteristics and the stored signature that is unique to the predetermined location indicates that the test instrument is connected at the predetermined test location associated with the stored signature.

10. The non-transitory computer-readable storage medium of claim 9, further comprising:
performing, in response to determining the port is not connected to the minimum length cable, at least one of providing notification that the test instrument is not connected to the minimum length cable and preventing measurements of signals received via the port.

11. The non-transitory computer-readable storage medium of claim 10, wherein determining whether the port is connected to a minimum length cable comprises:
determining a reflection time of the pulse; and
determining whether the minimum length cable is connected to the port based on the reflection time.

12. The non-transitory computer-readable storage medium of claim 11, wherein determining whether the minimum length cable is connected to port is based on the reflection time and a signal transmission velocity of a predetermined cable.

13. The non-transitory computer-readable storage medium of claim 9, wherein the pulse comprises a time domain reflectometry pulse or a frequency domain reflectometry pulse.

14. The non-transitory computer-readable storage medium of claim 9, further comprising:
providing notification that the test instrument is not connected at the predetermined location in response to determining the signature and the stored signature do not match; and
allowing measurement of the signals at the test instrument in response to determining the signature and the stored signature match.

15. The non-transitory computer-readable storage medium of claim 9, wherein the signature of the reflected pulse is based on amplitude and time of at least one peak in the reflected pulse.

16. A method comprising:
determine whether a port of a test instrument is connected to a minimum length cable by measuring, using a measurement circuit, characteristics of a reflected pulse received at the port, wherein the reflected pulse is a pulse generated by a pulse generator that is reflected and received via the port, and wherein the measured characteristics comprises at least one of amplitude, reflection time, or peak detection of the reflected pulse;
using a signature comparison technique to determine, by a processing circuit, in response to determining the port is connected to the minimum length cable, whether a signature determined from the measured characteristics of the reflected pulse matches a stored signature to determine whether the test instrument is connected at a predetermined test location, where the signature is a unique signature associated with different test points and compared to the stored signature at the same test points; and
determining, by the processing circuit, whether the test instrument is connected at these test points based on the comparison of the signature to the stored signature at the same test points.

17. The method of claim 16, wherein determining whether the minimum length cable is connected to port is based on the reflection time and a signal transmission velocity of a predetermined cable.

18. The method of claim 16, wherein the reflected pulse comprises a time domain pulse or a frequency domain pulse.

19. The method of claim 16, further comprising:
providing notification that the test instrument is not connected at the predetermined location in response to determining the signature and the stored signature do not match; and
allowing measurement of the signals at the test instrument in response to determining the signature and the stored signature match.

20. The method of claim 16, wherein the signature of the reflected pulse is based on amplitude and time of at least one peak in the reflected pulse.

\* \* \* \* \*